(12) United States Patent
Huang et al.

(10) Patent No.: US 11,652,477 B2
(45) Date of Patent: May 16, 2023

(54) VOLTAGE TRACKING CIRCUITS AND ELECTRONIC CIRCUITS

(71) Applicant: Vanguard International Semiconductor Corporation, Hsinchu (TW)

(72) Inventors: Shao-Chang Huang, Hsinchu (TW); Ching-Ho Li, Hsinchu (TW); Kai-Chieh Hsu, Taoyuan (TW); Chun-Chih Chen, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 17/356,643

(22) Filed: Jun. 24, 2021

(65) Prior Publication Data

US 2022/0416778 A1 Dec. 29, 2022

(51) Int. Cl.
*H03K 17/16* (2006.01)
(52) U.S. Cl.
CPC ................... *H03K 17/161* (2013.01)
(58) Field of Classification Search
CPC ........... H03K 17/161; H03K 17/08104; H03K 17/0814
USPC ............. 327/58, 62, 534; 326/81–83
See application file for complete search history.

(56) References Cited

U.S. PATENT DOCUMENTS

| | | | |
|---|---|---|---|
| 6,717,445 B1 | 4/2004 | Nair | |
| 6,847,249 B1* | 1/2005 | Brokaw | H03K 17/693 327/407 |
| 7,295,040 B1* | 11/2007 | Nguyen | H03K 19/00315 326/83 |
| 7,489,559 B2* | 2/2009 | Dray | H03K 17/102 365/185.25 |
| 8,120,984 B2* | 2/2012 | Huang | H03K 17/693 365/189.11 |
| 9,088,158 B2* | 7/2015 | Maggio | H02H 3/18 |

(Continued)

FOREIGN PATENT DOCUMENTS

TW        I684089 B    2/2020

OTHER PUBLICATIONS

Taiwanese Office Action and Search Report for Taiwanese Application No. 110113393, dated May 20, 2022.

*Primary Examiner* — Ryan Johnson
*Assistant Examiner* — Colleen J O Toole
(74) *Attorney, Agent, or Firm* — Birch, Stewart, Kolasch & Birch, LLP

(57) ABSTRACT

A voltage tracking circuit is provided and includes first and second P-type transistors and a voltage reducing circuit. The drain of the first P-type transistor is coupled to a first voltage terminal. The voltage reducing circuit is coupled between the first voltage terminal and the gate of the first P-type transistor. The voltage reducing circuit reduces a first voltage at the first voltage terminal by a modulation voltage to generate a control voltage and provides the control voltage to the gate of the first P-type transistor. The gate of the second P-type transistor is coupled to the first voltage terminal, and the drain thereof is coupled to a second voltage terminal. The source of the first P-type transistor and the source of the second P-type transistor are coupled to the output terminal of the voltage tracking circuit. The output voltage is generated at the output terminal.

20 Claims, 10 Drawing Sheets

(56) References Cited

U.S. PATENT DOCUMENTS

2015/0077188 A1 3/2015 Zhan
2017/0111013 A1 4/2017 Khasnis et al.

* cited by examiner

VOLTAGE TRACKING CIRCUITS AND ELECTRONIC CIRCUITS

BACKGROUND OF THE INVENTION

Field of the Invention

The present invention relates to a voltage tracking circuit, and more particularly to a voltage tracking circuit for a high-voltage circuit.

Description of the Related Art

Generally, when an N-type metal oxide semiconductor (NMOS) transistor is used on the high-voltage side of an electronic circuit, an over-voltage event may occur on its source/bulk, and, thus, the parasitic bipolar diode of the NMOS transistor is turned on, which induces a leakage current. The leakage current may cause the electronic circuit to be overheated and then damage the electronic circuit. Therefore, how to reduce the leakage current caused by the occurrence of the overvoltage is an important issue.

BRIEF SUMMARY OF THE INVENTION

An exemplary embodiment of the present invention provides a voltage tracking circuit. The voltage tracking circuit is used for tracking one of a first voltage at a first voltage terminal and a second voltage at a second voltage terminal to generate an output voltage. The voltage tracking circuit comprises a first P-type transistor, a voltage reducing circuit, and a second P-type transistor. The first P-type transistor has a gate, a drain, and a source. The drain of the first P-type transistor is coupled to the first voltage terminal. The voltage reducing circuit is coupled between the first voltage terminal and the gate of the first P-type transistor. The voltage reducing circuit provides a modulation voltage. The voltage reducing circuit reduces the first voltage by the modulation voltage to generate a control voltage and provides the control voltage to the gate of the first P-type transistor. The second P-type transistor has a gate, a drain, and a source. The gate of the second P-type transistor is coupled to the first voltage terminal, and the drain of the second P-type transistor is coupled to the second voltage terminal. The source of the first P-type transistor and the source of the second P-type transistor are coupled to an output terminal of the voltage tracking circuit. The output voltage is generated at the output terminal.

An exemplary embodiment of the present invention provides an electronic circuit. The electronic circuit comprises a high-voltage-side component and a voltage tracking circuit. The high-voltage side component has a first electrode terminal and a second electrode terminal. The high-voltage side component is surrounded by an isolated deep well region. The voltage tracking circuit is coupled to the first electrode terminal and the second electrode terminal. The voltage tracking circuit tracks one of a first voltage at the first electrode terminal and a second voltage at the second electrode terminal to generate an output voltage at an output terminal and applies the output voltage to the isolated deep well region surrounding the high-voltage-side component. The voltage tracking circuit comprises a first P-type transistor, a voltage reducing circuit, and a second P-type transistor. The first P-type transistor has a gate, a drain, and a source. The drain of the first P-type transistor is coupled to the first electrode terminal. The voltage reducing circuit is coupled between the first electrode terminal and the gate of the first P-type transistor. The voltage reducing circuit provides a modulation voltage. The voltage reducing circuit reduces the first voltage by the modulation voltage to generate a control voltage and provides the control voltage to the gate of the first P-type transistor. The second P-type transistor has a gate, a drain, and a source. The gate of the second P-type transistor is coupled to the first electrode terminal, and the drain of the second P-type transistor is coupled to the second electrode terminal. The source of the first P-type transistor and the source of the second P-type transistor are coupled to the output terminal of the voltage tracking circuit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated model of carrying out the invention. This description is made for the purpose of illustrating the general principles of the invention and should not be taken in a limiting sense. The scope of the invention is best determined by reference to the appended claims.

Figure 1:
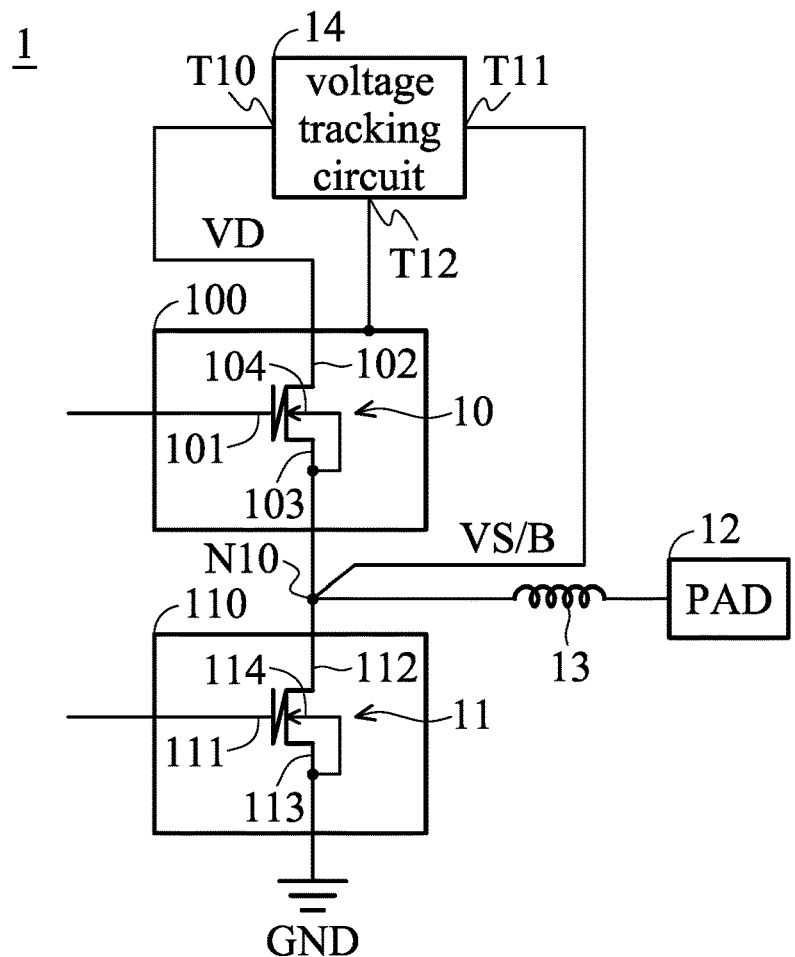
FIG. 1 shows an electronic circuit of an embodiment of the present invention.

FIG. 1 shows an electronic circuit according to an embodiment of the present invention. Referring to FIG. 1, an electronic circuit 1 comprises an N-type metal oxide semiconductor (NMOS) transistor 10 located on the high-voltage side (i.e., a high-voltage-side element), an input/output pad (PAD) 12, an inductor 13, and a voltage tracking circuit 14. In an embodiment, the electronic circuit 1 further comprises an NMOS transistor 11 on the low-voltage side (i.e., a low-voltage side element). In the embodiment, the NMOS transistors 10 and 11 are N-type laterally diffused metal oxide semiconductor (LDMOS) transistors, and each is surrounded by an N-type isolated deep well region. In FIG. 1, the element reference "100" represents the N-type isolation deep well region surrounding the LDNMOS transistor 10, and the element reference "110" represents the N-type isolation deep well region surrounding the LDNMOS transistor 11.

The LDNMOS transistor 10 comprises four electrode terminals 101~104, which are a gate 101, a drain 102, a source 103, and a bulk 104, respectively. The gate 101 receives a signal generated from another component in the electronic circuit 1. The drain 102 is coupled to a voltage terminal T10 of the voltage tracking circuit 14. The source 103 and the bulk 104 are coupled together at a node N10. A voltage terminal T11 of the voltage tracking circuit 14 is coupled to the node N10, that is, to the source/bulk 103/104. The LDNMOS transistor 11 comprises four electrode terminals 111~114, which are a gate 111, a drain 112, a source 113, and a bulk 114, respectively. The gate 111 receives a signal generated from another component in the electronic circuit 1. The drain 112 is coupled to the node N10. Both of the source 113 and the bulk 114 are coupled to a ground terminal GND. The inductor 113 is coupled between the node N10 and the input/output pad 12.

Referring to FIG. 1, the voltage terminal T10 of the voltage tracking circuit 14 is coupled to the drain 102 of the LDNMOS transistor 10, and the voltage terminal T11 thereof is coupled to the source/bulk 103/104 of the LDNMOS transistor 10. When the electronic circuit 1 operates, the voltage tracking circuit 14 generates an output voltage VTH at an output terminal T12 according to the one with the higher level among the voltage VD at the drain 102 and the voltage VS/B at the source/bulk 103/104. In other words, the voltage tracking circuit 14 tracks the one with the high level among the voltage VD at the drain 102 and the voltage VS/B at the source/bulk 103/104, and outputs the output voltage VTH which is equal to the tracked voltage. Therefore, the voltage tracking circuit 14 can change the output voltage VTH according to the voltages VD and VS/B. The voltage tracking circuit 14 provides the generated output voltage VTH to the N-type isolated deep well region 100 surrounding the LDNMOS transistor 10. In some cases, when an overvoltage event occurs at the I/O pad 10, the voltage VS/B increases through the inductor 13 to be higher than the voltage VD. At this time, through the operation of the voltage tracking circuit 14, the output voltage VTH increases with the voltage VS/B. In response to the increment of the output voltage VTH, the parasitic bipolar transistor related to the N-type isolated deep well region 100 can be turned off, or the turned-on efficiency of the parasitic bipolar transistor related to the N-type isolated deep well region 100 can be reduced, thereby avoiding or reducing leakage currents. According to the above description, controlling the output voltage VTH applied to the N-type isolated deep well region 100 by the voltage tracking circuit 14 can prevent the high temperature caused by leakage currents from damaging the electronic components in the electronic circuit 1.

Various embodiments and the operation of the voltage tracking circuit 14 will be described below.

Figure 2A:
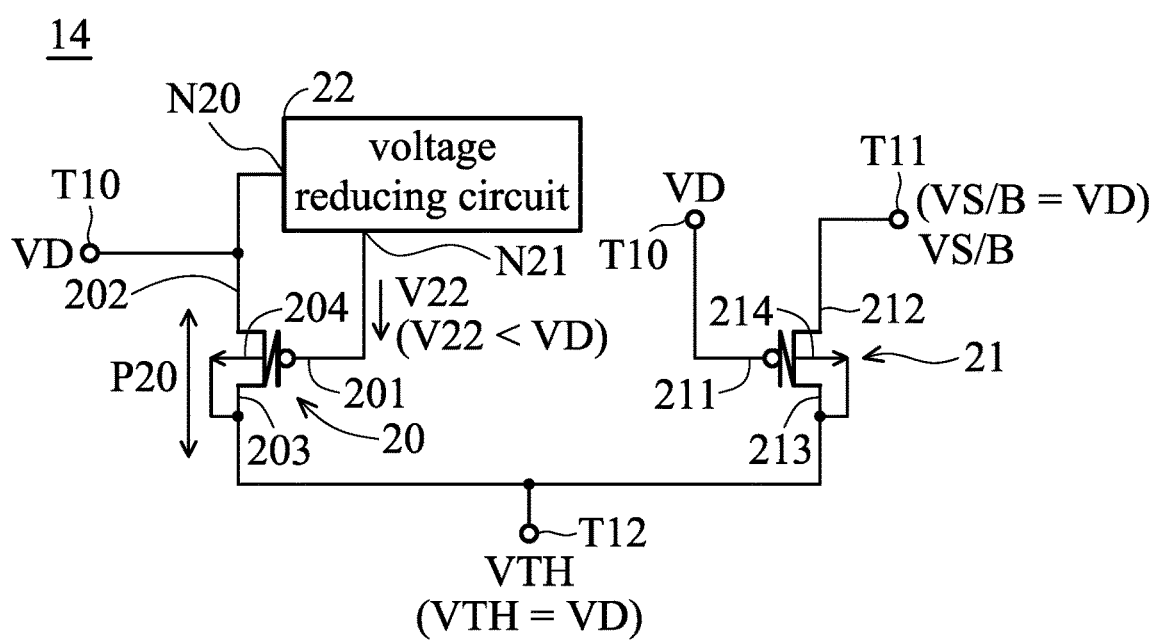
FIGS. 2A~2C are schematic diagrams showing an operation of a voltage tracking circuit in FIG. 1 under different voltage conditions according to an embodiment of the present invention.
Figure 2B:
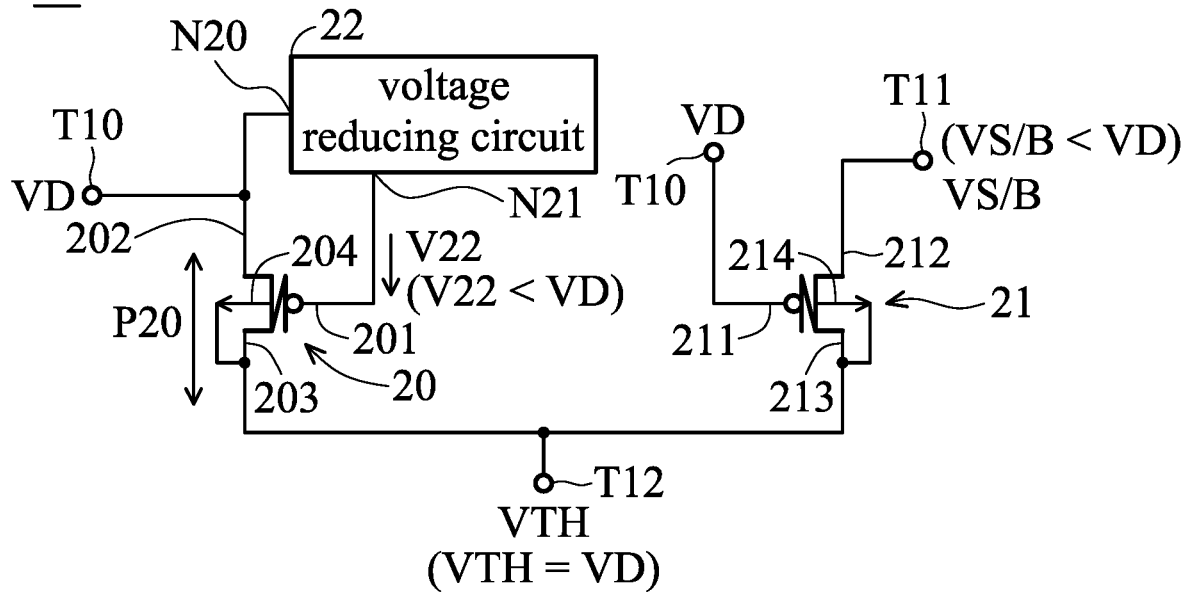
Figure 2C:
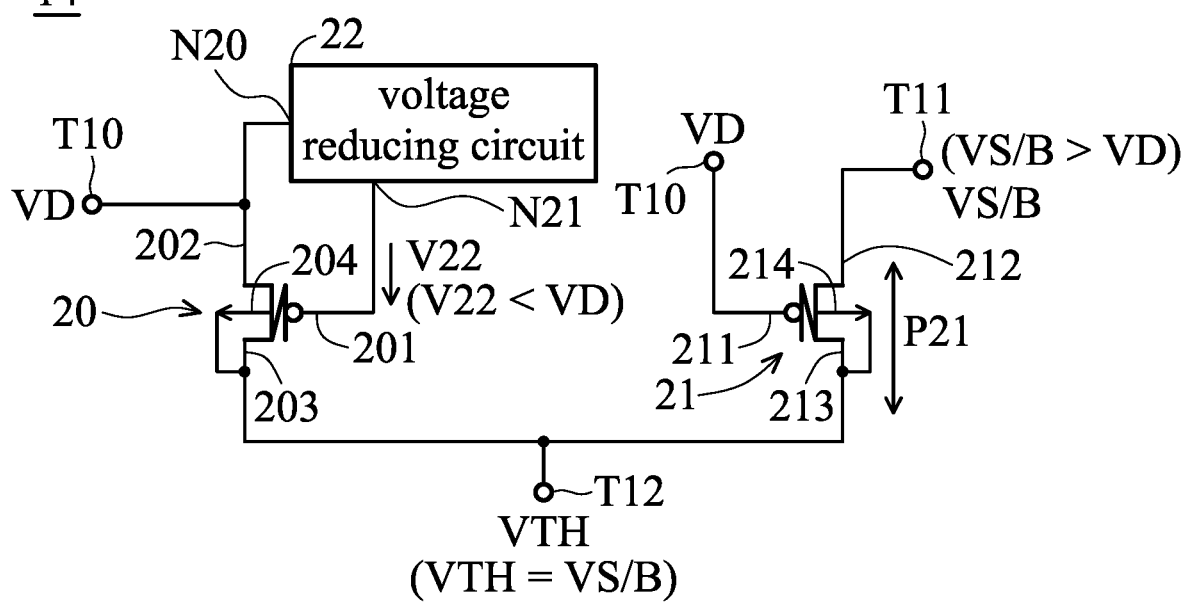

FIGS. 2A, 2B, and 2C are schematic diagrams showing the operation of the voltage tracking circuit in FIG. 1 under different voltage conditions according to an embodiment of the present invention. The voltage tracking circuit 14 comprises P-type metal oxide semiconductor (PMOS) transistors 20 and 21 and a voltage reducing circuit 22. The PMOS transistor 20 comprises four electrode terminals 201~204, which are a gate 201, a drain 202, a source 203, and a bulk 204, respectively. The drain 202 is coupled to the voltage terminal T10, and the source 203 and bulk 204 are coupled to the output terminal T12. The voltage reducing circuit 22 comprises an input node N20 and an output node N21. The input node N20 is coupled to the voltage terminal T10, and the output node N21 is coupled to the gate 201 of the PMOS transistor 20. The PMOS transistor 21 comprises four electrode terminals 211~214, which are a gate 211, a drain 212, a source 213, and a bulk 214, respectively. The gate 211 is coupled to the voltage terminal T10, the drain 212 is coupled to the voltage terminal T11, and the source 213 and bulk 214 are coupled to the output terminal T12.

Referring to FIG. 2A, when the electronic circuit 1 operates, the voltage tracking circuit 14 receives the voltage VD through the power terminal T10 and further receives the voltage VS/B through the power terminal T11. In the embodiment of FIG. 2A, the voltage VS/B is equal to the voltage VD (VS/B=VD). For example, both of the voltage VD and the voltage VS/B are 44V. At this time, the PMOS transistor 21 is turned off. The voltage reducing circuit 22 provides a modulation voltage. When the voltage reducing circuit 22 receives the voltage VD through the input node N20, the voltage reducing circuit 22 performs a voltage reducing operation to reduce the voltage VD by the modulation voltage and generate a control voltage V22 at the output node N21. In other words, the voltage reducing circuit 22 generates the control voltage V22 according to the voltage VD, and the control voltage V22 is less than the voltage VD (V22<VD). For example, the control voltage V22 is 41.9V. At this time, the voltage of the gate 201 of the PMOS transistor 20 is equal to the control voltage V22. Since the control voltage V22 is less than the voltage VD, the PMOS transistor 20 is turned on to provide a current path P20. Through the current path P20, the output voltage VTH at the output terminal T12 follows the voltage VD and increases with the voltage VD. Finally, the output voltage VTH is equal to the voltage VD (VTH=VD).

Referring to FIG. 2B, in some cases, the voltage VS/B is less than the voltage VD (VS/B<VD) (for example, the voltage VD is 44V while the voltage VS/B is 0V). At this time, the PMOS transistor 21 is turned off. The voltage reducing circuit 22 performs the voltage reducing operation to reduce the voltage VD by the modulation voltage to generate the control voltage V22 at the output node N21. The control voltage V22 is less than the voltage VD (V22<VD). For example, the control voltage V22 is 41.9V. At this time, the voltage of the gate 201 of the PMOS transistor 20 is equal to the control voltage V22. Since the control voltage V22 is less than the voltage VD, the PMOS transistor 20 is turned on to provide the current path P20. Through the current path P20, the output voltage VTH at the output terminal T12 follows the voltage VD and increases with the voltage VD. Finally, the output voltage VTH is equal to the voltage VD (VTH=VD).

Referring to FIG. 2C, in some cases, the voltage VS/B is greater than the voltage VD (VS/B>VD) (for example, the voltage VD is 44V while the voltage VS/B is 46.5V). The voltage reducing circuit 22 also performs the aforementioned voltage reducing operation. At this time, the PMOS transistor 21 is turned on to provide a current path P21. Through the current path P21, the output voltage VTH at the output terminal T12 follows the voltage VS/B and increases with the voltage SS/B. Finally, the output voltage VTH is equal to the voltage VS/B (VTH=VS/B).

According to the above embodiment, the voltage tracking circuit 14 generates the output voltage VTH at the output terminal T12 according to the one with the higher level among the voltage VD and the voltage VS/B. In this way, the output voltage VTH follows the one with the higher level among the voltage VD and the voltage VS/B through the voltage tracking circuit 14.

The voltage reducing circuit 22 in the embodiment comprises a plurality of voltage reducing elements connected in series between the input node N20 and the output node N21, thereby achieving the voltage reducing operation. There are several implementations for the voltage reducing elements. The detailed structure of the voltage reducing circuit 22 will be described below through FIGS. 3~5.

Figure 3:
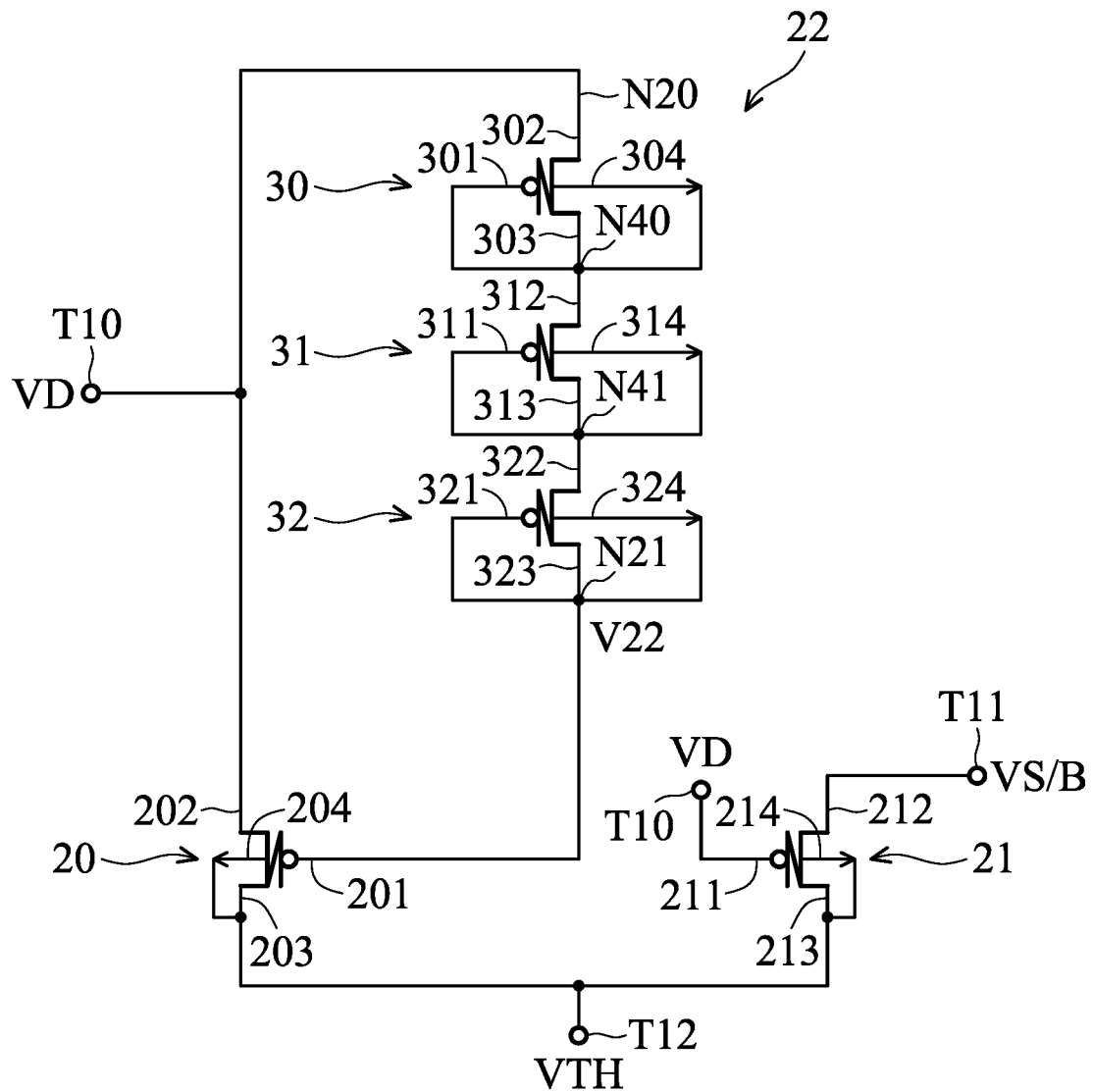
FIG. 3 shows the voltage tracking circuit in FIG. 1 according to an embodiment of the present invention, and a voltage reducing circuit in the voltage tracking circuit has a first structure.

FIG. 3 shows the voltage tracking circuit 14 according to another embodiment of the present invention, in which the voltage reducing circuit 22 has a first structure. Referring to FIG. 3, the voltage reducing circuit 22 comprises PMOS transistors (voltage reducing elements) 30~32 connected in series between the input node N20 and the output node N21. The number of PMOS transistors can be determined according to actual requirements. The present invention is not limited to the case where there are three PMOS transistors in the voltage reducing circuit 22. The PMOS transistor 30 has four electrode terminals 301~304, which are a gate 301, a drain 302, a source 303, and a bulk 304, respectively. The drain 302 is coupled to the input node N20. The gate 301, the source 303, and the bulk 304 are coupled to a node N30. The PMOS transistor 31 has four electrode terminals 311~314, which are a gate 311, a drain 312, a source 313, and a bulk 314, respectively. The drain 312 is coupled to the node N30. The gate 311, the source 313, and the bulk 314 are coupled to a node N31. The PMOS transistor 32 has four electrode terminals 321~324, which are a gate 321, a drain 322, a source 323, and a bulk 324, respectively. The drain 322 is coupled to the node N31. The gate 311, the source 313, and the bulk 314 are coupled to the output node N21.

For example, when the electronic circuit 1 operates, the voltage tracking circuit 14 receives the voltage VD through the power terminal T10, such as 44V, however, the present invention is not limited thereto. At this time, each of the PMOS transistors 30~32 is in an off state. Since there are parasitic diodes in the PMOS transistors 30~32 respectively, each of the PMOS transistors 30~32 provides a cross-voltage of about 0.7V between drain and source thereof. Therefore, the voltage difference between the input node N20 and the output node N21 of the voltage reducing circuit 22 is about 2.1V (0.7V×3=2.1V). The voltage difference (2.1V) between the input node N20 and the output node N21 is used as the modulation voltage provided by the voltage reducing circuit 22. At this time, the control voltage V22 at the output node N21 is equal to 41.9V (44V−2.1V=41.9V), thereby achieving the voltage reducing operation. That is, the voltage VD is reduced by the modulation voltage, and, thus, the control voltage V22 is generated at the output node N21 after the reduction. However, the values of the voltages are not intended to limited to the invention.

Figure 4:
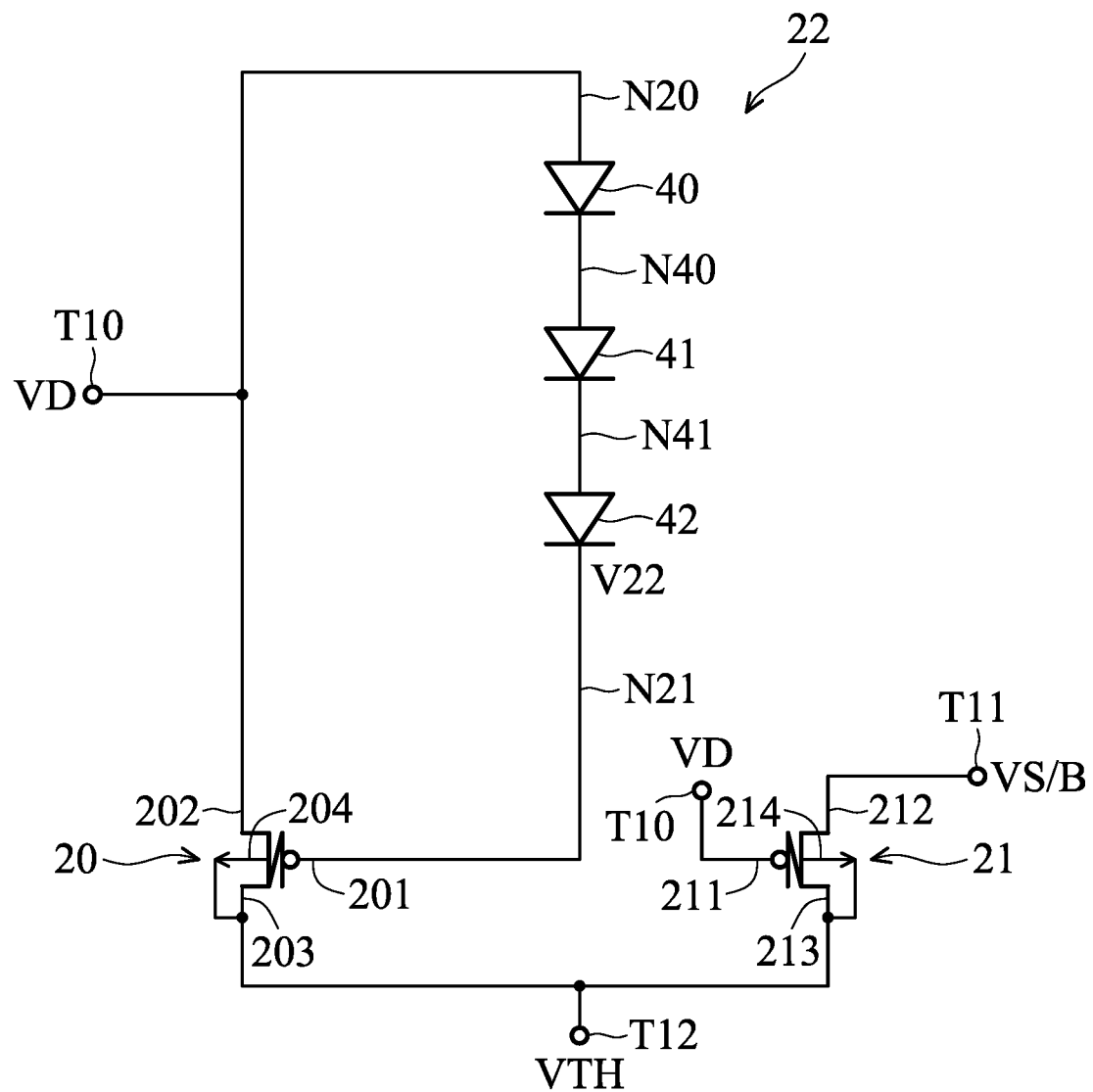
FIG. 4 shows the voltage tracking circuit in FIG. 1 according to another embodiment of the present invention, and the voltage reducing circuit in the voltage tracking circuit has a second structure.

FIG. 4 shows the voltage tracking circuit 14 according to another embodiment of the present invention, in which the voltage reducing circuit 22 has a second structure. Referring to FIG. 4, the voltage reducing circuit 22 comprises diodes (voltage reducing elements) 40~42 connected in series between the input node N20 and the output node N21. The number of the diodes 40~42 can be determined according to actual requirements. The present invention is not limited to the case where there are three diodes in the voltage reducing circuit 22. The anode of the diode 40 is coupled to the input node N20, and the cathode of the diode 40 is coupled to a node N40. The anode of the diode 41 is coupled to the node N40, and the cathode of the diode 41 is coupled to a node N41. The anode of the diode 42 is coupled to the node N41, and the cathode of the diode 42 is coupled to the output node N21.

For example, when the electronic circuit 1 operates, the voltage tracking circuit 14 receives the voltage VD through the power terminal T10, such as 44V, however, the present invention is not limited thereto. At this time, each of the diodes 40~42 provides a cross-voltage of about 0.7V between the anode and the cathode thereof. Therefore, the voltage difference between the input node N20 and the output node N21 of the voltage reducing circuit 22 is 2.1V (0.7V×3=2.1V). The voltage difference (2.1V) between the input node N20 and the output node N21 is used as the modulation voltage provided by the voltage reducing circuit 22. At this time, the control voltage V22 at the output node N21 is equal to 41.9V (44V−2.1V=41.9V), thereby achieving the voltage reducing operation. That is, the voltage VD is reduced by the modulation voltage, and, thus, the control voltage V22 is generated at the output node N21 after the reduction. However, the values of the voltages are not intended to limited to the invention.

Figure 5:
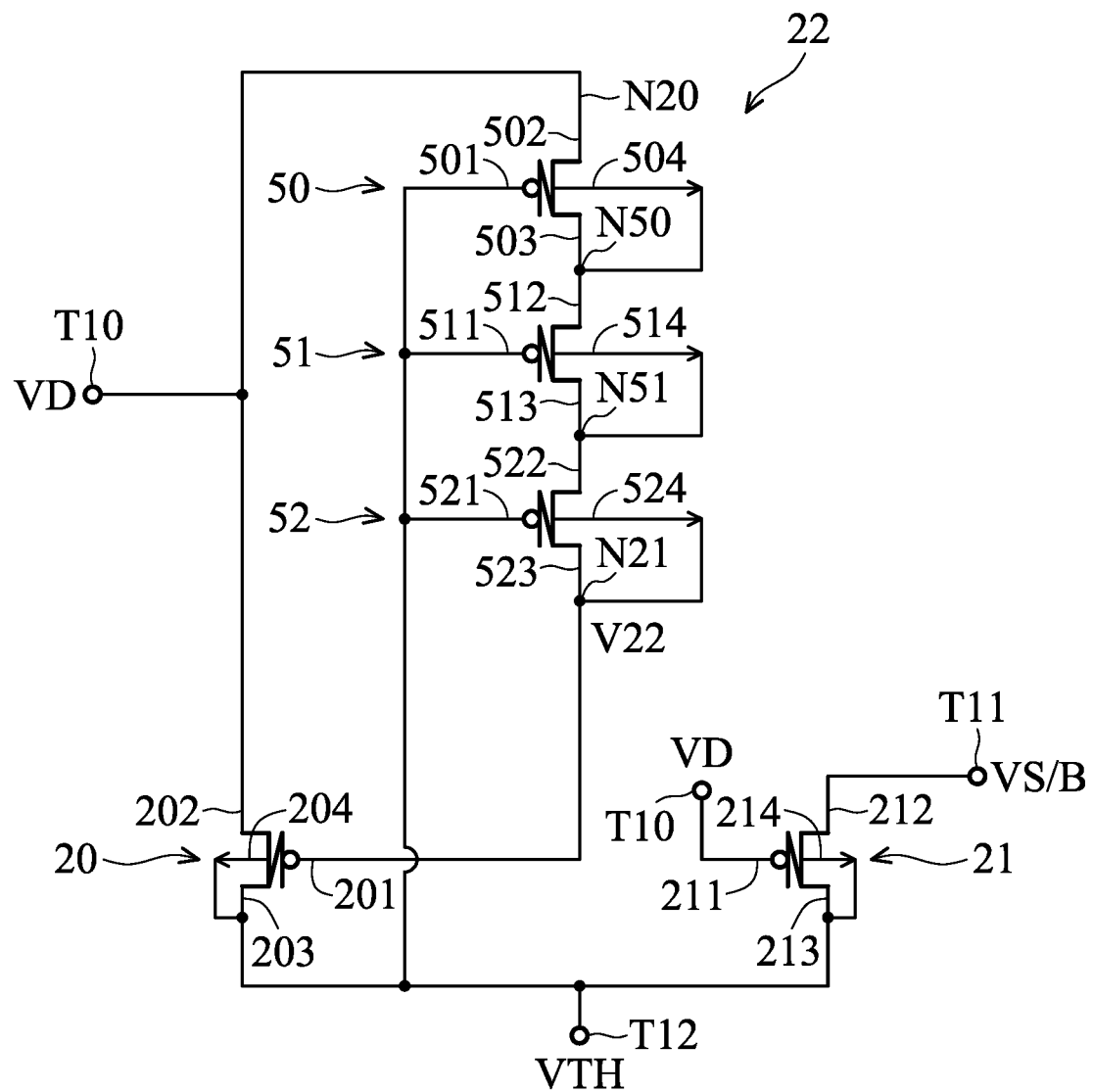
FIG. 5 shows the voltage tracking circuit in FIG. 1 according to an embodiment of the present invention, and the voltage reducing circuit in the voltage tracking circuit has a third structure.

FIG. 5 shows the voltage tracking circuit 14 according to another embodiment of the present invention, in which the voltage reducing circuit 22 has a third structure. Referring to FIG. 5, the voltage reducing circuit 22 comprises PMOS transistors (voltage reducing elements) 50~52 connected in series between the input node N20 and the output node N21. The number of PMOS transistors can be determined according to actual requirements. The present invention is not limited to the case where there are three PMOS transistors in the voltage reducing circuit 22. The PMOS transistor 50 has four electrode terminals 501~504, which are a gate 501, a drain 502, a source 503, and a bulk 504, respectively. The drain 502 is coupled to the input node N20. The source 503 and the bulk 504 are coupled to a node N50. The PMOS transistor 51 has four electrode terminals 511~514, which are a gate 511, a drain 512, a source 513, and a bulk 514, respectively. The drain 512 is coupled to the node N50. The source 513 and the bulk 514 are coupled to a node N51. The PMOS transistor 52 has four electrode terminals 521~524, which are a gate 521, a drain 522, a source 523, and a bulk 524, respectively. The drain 522 is coupled to the node N51. The source 513 and the bulk 514 are coupled to the output node N21. The gates 501, 511, and 521 of the PMOS transistors 50~53 are coupled to the output terminal T12.

For example, when the electronic circuit 1 operates, the voltage tracking circuit 14 receives the voltage VD through the power terminal T10, such as 44V, however, the present invention is not limited thereto. At this time, each of the PMOS transistors 50~52 is in an off state. Since there are parasitic diodes in the PMOS transistors 50~52 respectively, each of the PMOS transistors 50~52 provides a cross-voltage of about 0.7V between drain and source thereof. Therefore, the voltage difference between the input node N20 and the output node N21 of the voltage reducing circuit 22 is 2.1V (0.7V×3=2.1V). The voltage difference (2.1V) between the input node N20 and the output node N21 is used as the modulation voltage provided by the voltage reducing circuit 22. At this time, the control voltage V22 at the output node N21 is equal to 41.9V (44V−2.1V=41.9V), thereby achieving the voltage reducing operation. That is, the voltage VD is reduced by the modulation voltage, and, thus, the control voltage V22 is generated at the output node N21 after the reduction. In the embodiment, the output voltage VTH at the output terminal T12 follows the one with higher level among the voltage VD and the voltage VS/B. Thus, the gates 501, 511, and 521 of the PMOS transistors 50~53 have a higher voltage. Such that the PMOS transistors 50~53 can be in the off state stably. However, the values of the voltages are not intended to limited to the invention.

Figure 6:
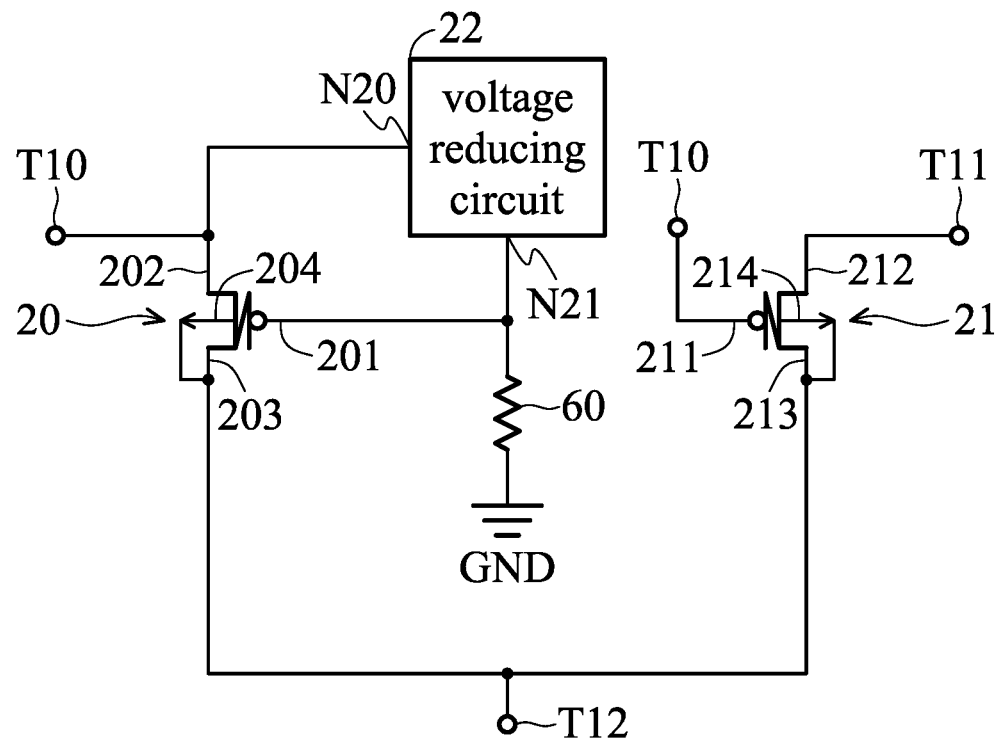
FIG. 6 shows the voltage tracking circuit of the electronic circuit in FIG. 1 according to another embodiment of the present invention.
Figure 7:
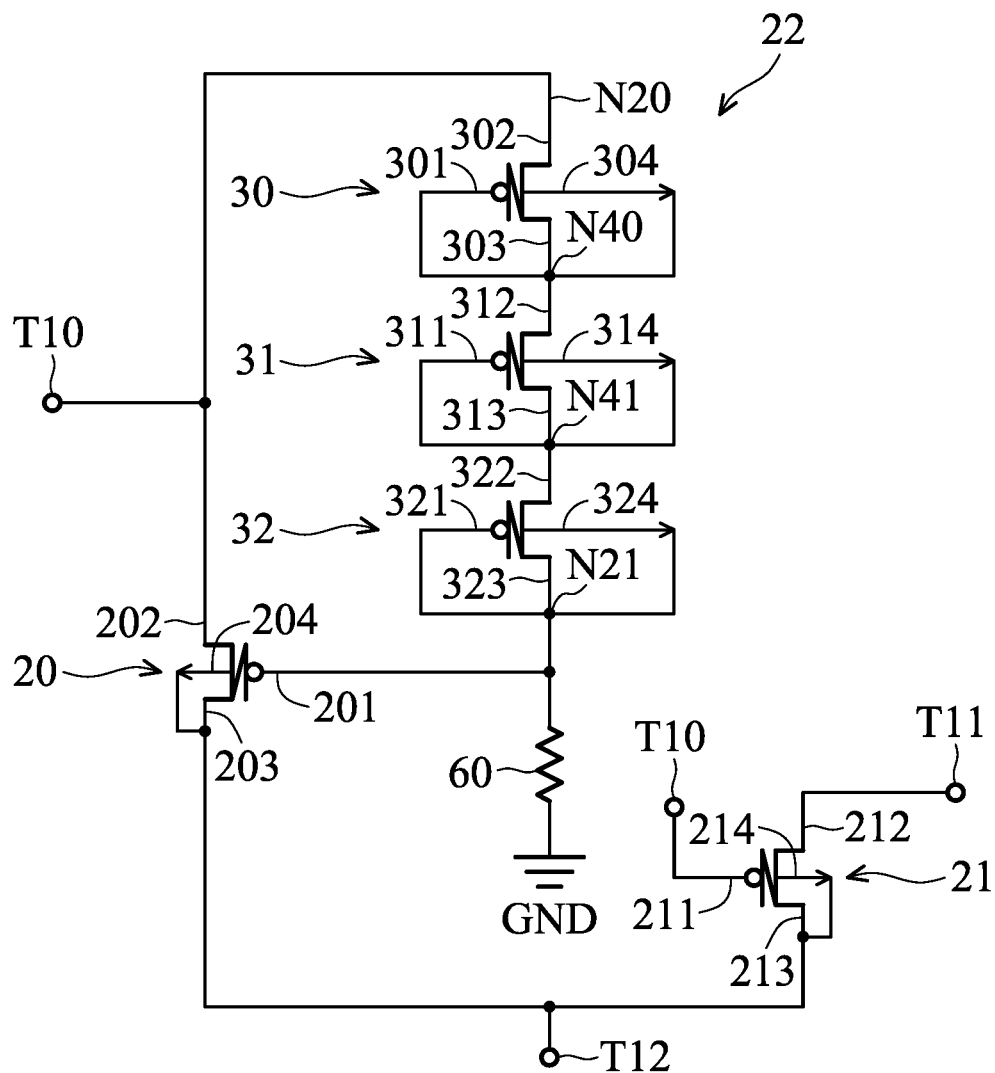
FIG. 7 shows the voltage tracking circuit in FIG. 6 according to an embodiment of the present invention, and the voltage reducing circuit in the voltage tracking circuit has the first structure.
Figure 8:
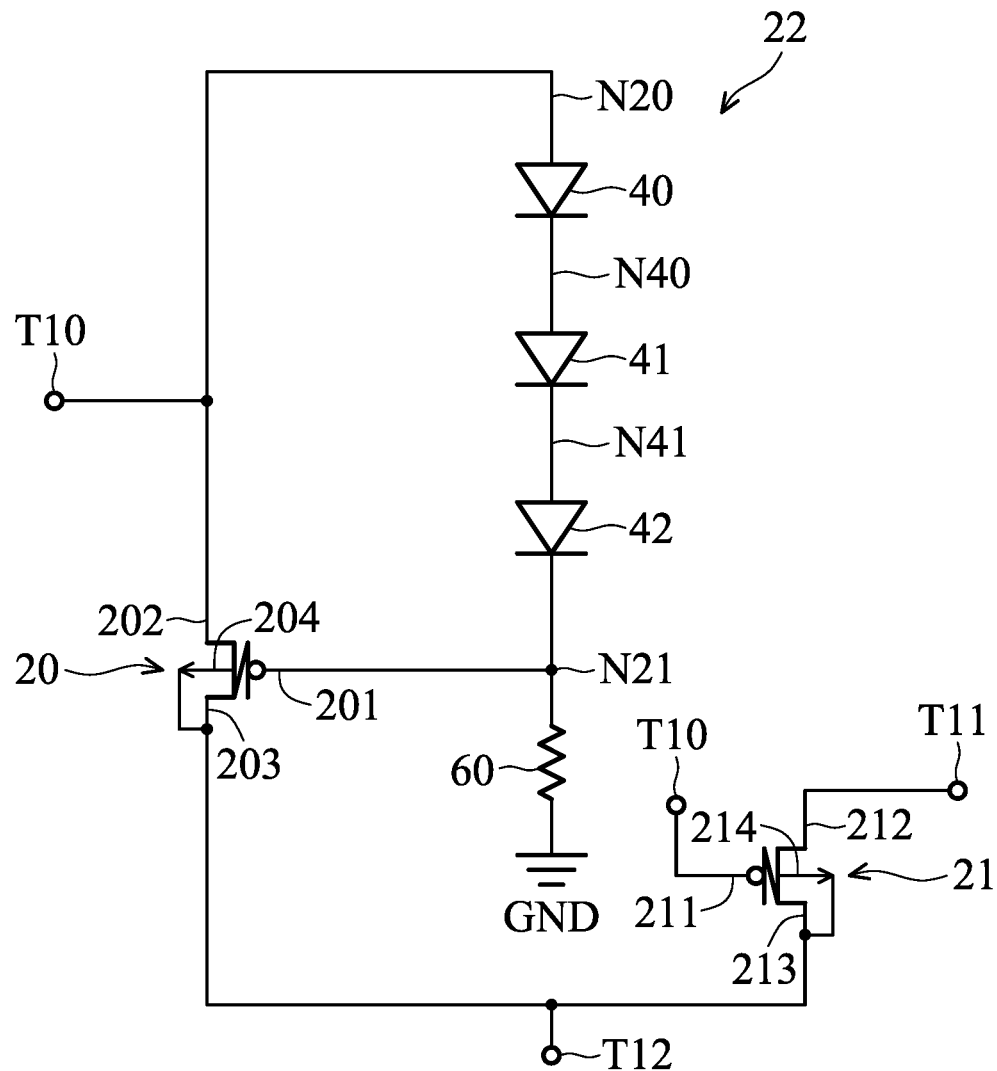
FIG. 8 shows the voltage tracking circuit in FIG. 6 according to another embodiment of the present invention, and the voltage reducing circuit in the voltage tracking circuit has a second structure.
Figure 9:
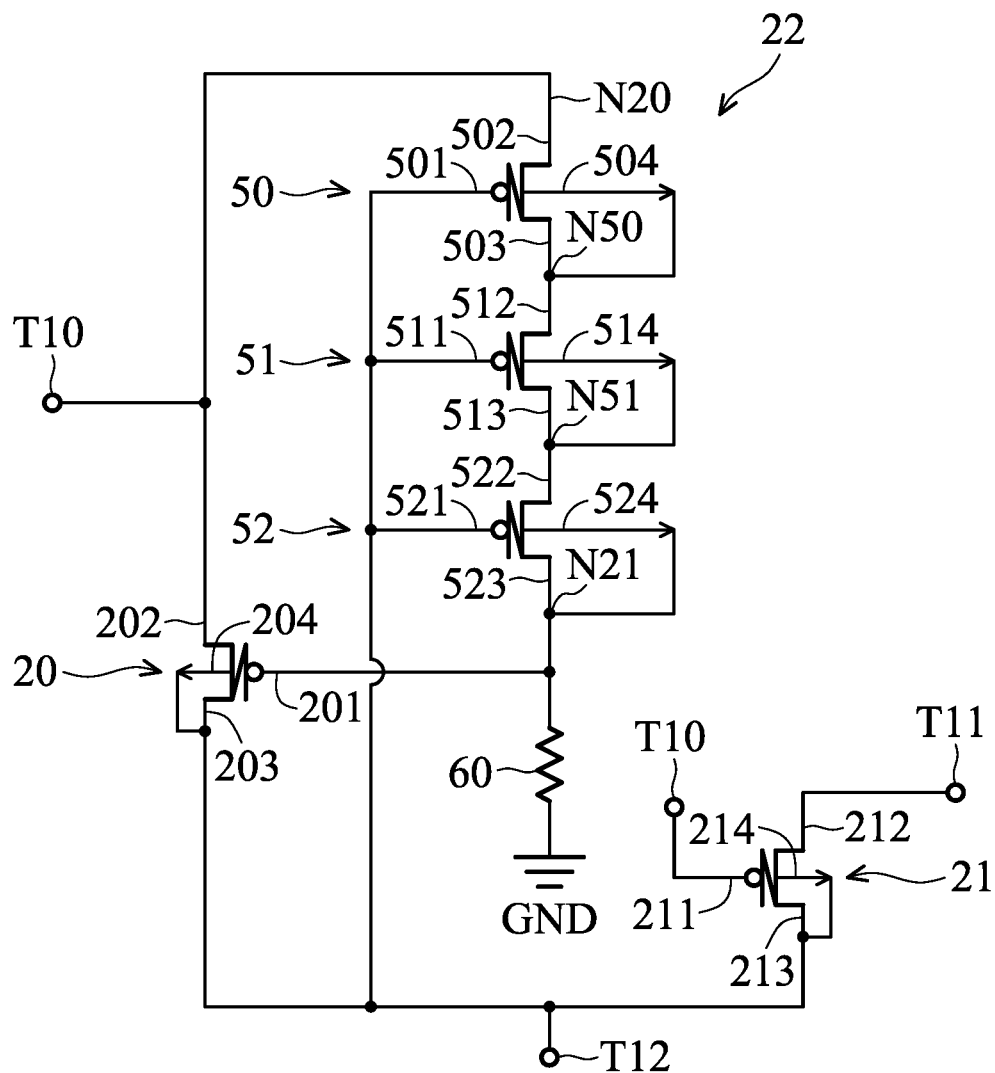
FIG. 9 shows the voltage tracking circuit in FIG. 6 according to an embodiment of the present invention, and the voltage reducing circuit in the voltage tracking circuit therein has a third structure.

In some embodiments, in order to rapidly raise the voltage of the gate of the PMOS transistor 20 in the voltage tracking circuit 14 toward the voltage VTH when the electronic circuit 1 operates, a resistor may be coupled between the output node N21 of the voltage reducing circuit 22 and the ground terminal GND, as shown in FIG. 6. Therefore, in each of the embodiments of the voltage reducing circuit 22 shown in FIGS. 3~5, a resistor 60 is coupled between the output node N21 of the voltage reducing circuit 22 and the ground terminal GND, as shown in FIGS. 7~9 respectively. For the first structure shown in FIG. 7, the voltage tracking circuit of FIG. 3 further comprises a resistor 60 coupled between the output node N21 of the voltage reducing circuit 22 and the ground terminal GND. For the second structure shown in FIG. 8, the voltage tracking circuit of FIG. 4 further comprises a resistor 60 coupled between the output node N21 of the voltage reducing circuit 22 and the ground terminal GND. For the third structure shown in FIG. 9, the voltage tracking circuit of FIG. 5 further comprises a resistor 60 coupled between the output node N21 of the voltage reducing circuit 22 and the ground terminal GND. The operation of the voltage tracking circuit shown in each of FIGS. 6~9 is the same as the previous embodiment, please refer to the description related to FIGS. 2A~5.

Figure 10:
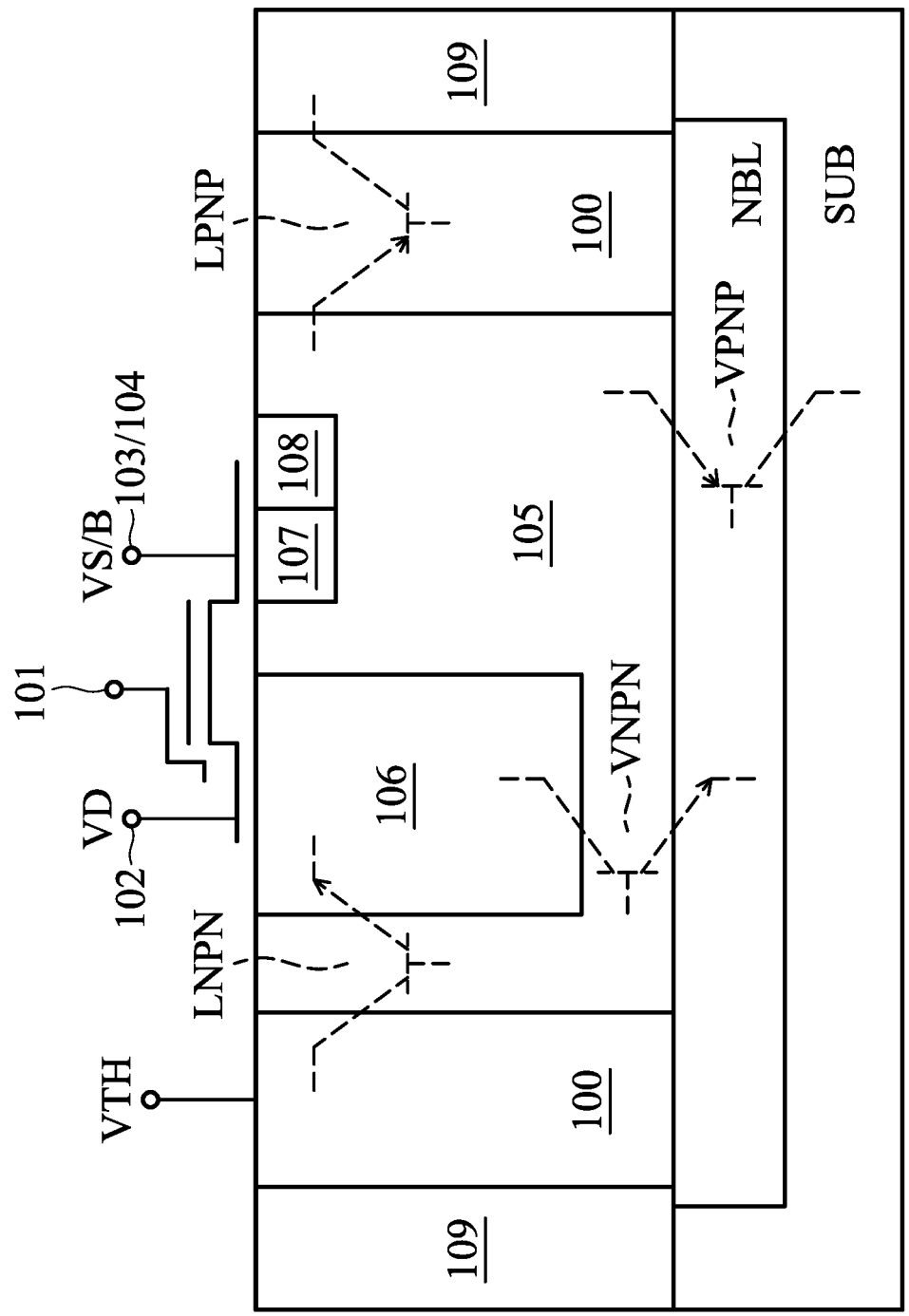
FIG. 10 shows a cross-sectional view showing a structure of a high-voltage-side NMOS transistor in FIG. 1.

FIG. 10 is a cross-sectional view showing a structure of the NMOS transistor 10 on the high-voltage side of FIG. 1. Referring to FIG. 10, the NMOS transistor 10 is formed on a P-type substrate SUB. An N-type buried layer NBL and a P-type well region 109 are formed in the P-type substrate SUB. The N-type isolation deep well region 100 is formed on the N-type buried layer NBL and is located in the P-type well region 109. A P-type well area 105 is formed in the N-type isolated deep well region 100. An N-type well region 106 is formed in the P-type well region 105 to serve as the drain region of the NMOS transistor 10. A contact electrode electrically connected to the N-type well region 106 serves as the drain 102. An N-type doped region 107 is formed in the P-type well region 105 to serve as the source region of the NMOS transistor 10. A P-type doped region 108 is formed in the P-type well region 105 to serve as the bulk region of the NMOS transistor 10. The contact electrodes electrically connected to the N-type doped region 107 and the P-type doped region 108 respectively serve as the source 103 and the bulk 104. Since the source 103 and the bulk 104 are connected to each other, FIG. 10 only shows a single contact electrode. A gate dielectric layer and a gate layer are formed on the P-well region 105, and a contact electrode electrically connected to the gate layer serves as the gate 101.

According to the structure of FIG. 10, there are several parasitic bipolar transistors. The parasitic bipolar transistors comprises a parasitic NPN bipolar transistor LNPN which is formed between the N-type isolated deep well region 100, the P-type well region 105, and the N-type well region 106, a parasitic PNP bipolar transistor LPNP which is formed between the P-type well region 105, the N-type isolated deep well region 100, and the P-type well region 109, a parasitic NPN bipolar transistor VNPN which is formed between the N-type well region 106, the P-type well region 105, and the N-type buried layer NBL, and a parasitic PNP bipolar transistor VPNP which is formed between the P-type well 105, the N-type buried layer NBL, and the P-type substrate SUB.

As shown in FIG. 10, the N-type isolated deep well region 100 is not connected to the drain 102. The voltage of the N-type isolated deep well region 100 and the voltage of the drain 102 are independent of each other. According to the operation of the voltage tracking circuit 14 described above, the generated control voltage VTH is equal to the one with the higher level among the voltage VD and the voltage VS/B. By applying the control voltage VTH to the N-type isolation deep well region 100, the parasitic transistors are prevented from being turned on, for example, the parasitic transistors comprise at least one of the NPN bipolar transistors LNPN, the parasitic PNP bipolar transistors LPNP, the parasitic NPN bipolar transistors VNPN, and the parasitic PNP bipolar transistor VPNP, however, the present invention is not limited thereto this. In one embodiment, none of the above-mentioned parasitic transistors are turned on. For example, in the cases where the voltage VS/B is greater than the voltage VD, the voltage tracking circuit 14 generates the control voltage VTH which is equal to the voltage VS/B, so that the voltage of the N-type isolated deep well region 100 is close to or equal to the voltage of the N-type buried layer NBL. Therefore, the parasitic NPN bipolar transistor VNPN and the parasitic PNP bipolar transistor VPNP are not turned on, which reduces the leakage current through the substrate.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage tracking circuit for tracking one of a first voltage at a first voltage terminal and a second voltage at a second voltage terminal to generate an output voltage, comprising:
   a first P-type transistor having a gate, a drain, and a source, wherein the drain of the first P-type transistor is directly connected to the first voltage terminal;
   a voltage reducing circuit coupled between the first voltage terminal and the gate of the first P-type transistor and providing a modulation voltage, wherein the voltage reducing circuit reduces the first voltage by the modulation voltage to generate a control voltage and provides the control voltage to the gate of the first P-type transistor; and
   a second P-type transistor having a gate, a drain, and a source, wherein the gate of the second P-type transistor is coupled to the first voltage terminal, and the drain of the second P-type transistor is directly connected to the second voltage terminal,
   wherein the source of the first P-type transistor and the source of the second P-type transistor are coupled to an output terminal of the voltage tracking circuit, and the output voltage is generated at the output terminal.

2. The voltage tracking circuit as claimed in claim 1, wherein in response to the first voltage being greater than or equal to the second voltage, the output voltage is equal to the first voltage by a current path passing through the first P-type transistor.

3. The voltage tracking circuit as claimed in claim 1, wherein in response to the first voltage being less than the second voltage, the output voltage is equal to the second voltage by a current path passing through the second P-type transistor.

4. The voltage tracking circuit as claimed in claim 1, wherein the voltage reducing circuit comprises:
an input node, coupled to the first voltage terminal;
an output node coupled to the gate of the first P-type transistor; and
a plurality of voltage reducing components connected in series between the input node and the output node,
wherein the modulation voltage is a voltage difference between the input node and the output node.

5. The voltage tracking circuit as claimed in claim 4, further comprising:
a resistor coupled between the gate of the first P-type transistor and a ground terminal.

6. The voltage tracking circuit as claimed in claim 4, wherein the plurality of voltage reducing components comprise:
a third P-type transistor having a drain coupled to the input node and having a gate and a source both coupled to a first node;
a fourth P-type transistor having a drain coupled to the first node and having a gate and a source both coupled to a second node; and
a fifth P-type transistor having a drain coupled to the second node and having a gate and a source both coupled to the output node.

7. The voltage tracking circuit as claimed in claim 4, wherein the plurality of voltage reducing components comprise:
a first diode having an anode terminal coupled to the input node and a cathode terminal coupled to a first node;
a second diode having an anode terminal coupled to the first node and a cathode terminal coupled to a second node; and
a third diode having an anode terminal coupled to the second node and a cathode terminal coupled to the output node.

8. The voltage tracking circuit as claimed in claim 4, wherein the plurality of voltage reducing components comprise:
a third P-type transistor having a drain coupled to the input node, a source coupled to a first node, and a gate;
a fourth P-type transistor having a drain coupled to the first node, a source coupled to a second node, and a gate; and
a fifth P-type transistor having a drain coupled to the second node, a source coupled to the output node, and a gate,
wherein the gate of the third P-type transistor, the gate of the fourth P-type transistor, and the gate of the fifth P-type transistor are coupled to the output terminal of the voltage tracking circuit.

9. The voltage tracking circuit as claimed in claim 1, wherein in response to the voltage tracking circuit operating, the first voltage is maintained at a constant value, and the second voltage is a variable voltage.

10. The voltage tracking circuit as claimed in claim 1, wherein the output voltage is applied to an isolated deep well region surrounding a high-voltage-side component.

11. An electronic circuit comprising:
a high-voltage-side element having a first electrode terminal and a second electrode terminal and surrounded by an isolated deep well region; and
a voltage tracking circuit, coupled to the first electrode terminal and the second electrode terminal, for tracking one of a first voltage at the first electrode terminal and a second voltage at the second electrode terminal to generate an output voltage at an output terminal and applying the output voltage to the isolated deep well region surrounding the high-voltage-side component,
wherein the voltage tracking circuit comprises:
a first P-type transistor having a gate, a drain, and a source, wherein the drain of the first P-type transistor is directly connected to the first electrode terminal;
a voltage reducing circuit coupled between the first electrode terminal and the gate of the first P-type transistor and providing a modulation voltage, wherein the voltage reducing circuit reduces the first voltage by the modulation voltage to generate a control voltage and provides the control voltage to the gate of the first P-type transistor; and
a second P-type transistor having a gate, a drain, and a source, wherein the gate of the second P-type transistor is coupled to the first electrode terminal, and the drain of the second P-type transistor is directly connected to the second electrode terminal,
wherein the source of the first P-type transistor and the source of the second P-type transistor are coupled to the output terminal of the voltage tracking circuit.

12. The electronic circuit as claimed in claim 11, wherein in response to the first voltage being greater than or equal to the second voltage, the output voltage is equal to the first voltage by through a current path passing through the first P-type transistor.

13. The electronic circuit as claimed in claim 11, wherein in response to the first voltage being less than the second voltage, the output voltage is equal to the second voltage by a current path passing through the second P-type transistor.

14. The electronic circuit as claimed in claim 11, wherein the voltage reducing circuit comprises:
an input node, coupled to the first electrode terminal;
an output node coupled to the gate of the first P-type transistor; and
a plurality of voltage reducing components connected in series between the input node and the output node,
wherein the modulation voltage is a voltage difference between the input node and the output node.

15. The electronic circuit as claimed in claim 14, wherein the voltage tracking circuit further comprises:
a resistor coupled between the gate of the first P-type transistor and a ground terminal.

16. The electronic circuit as claimed in claim 14, wherein the plurality of voltage reducing components comprise:
a third P-type transistor having a drain coupled to the input node and having a gate and a source both coupled to a first node;
a fourth P-type transistor having a drain coupled to the first node and having a gate and a source both coupled to a second node; and
a fifth P-type transistor having a drain coupled to the second node and having a gate and a source both coupled to the output node.

17. The electronic circuit as claimed in claim 14, wherein the plurality of voltage reducing components comprise:
   a first diode having an anode terminal coupled to the input node and a cathode terminal coupled to a first node;
   a second diode having an anode terminal coupled to the first node and a cathode terminal coupled to a second node; and
   a third diode having an anode terminal coupled to the second node and a cathode terminal coupled to the output node.

18. The electronic circuit as claimed in claim 14, wherein the plurality of voltage reducing components comprise:
   a third P-type transistor having a drain coupled to the input node, a source coupled to a first node, and a gate;
   a fourth P-type transistor having a drain coupled to the first node, a source coupled to a second node, and a gate; and
   a fifth P-type transistor having a drain coupled to the second node, a source coupled to the output node, and a gate,
   wherein, the gate of the third P-type transistor, the gate of the fourth P-type transistor, and the gate of the fifth P-type transistor are coupled to the output terminal of the voltage tracking circuit.

19. The electronic circuit as claimed in claim 11, wherein in response to the voltage tracking circuit operating, the first voltage is maintained at a constant value, and the second voltage is a variable voltage.

20. The electronic circuit as claimed in claim 11, wherein the high-voltage side component is an N-type laterally diffused metal oxide semiconductor (LDMOS) transistor, and a gate and a bulk of the N-type LDMOS transistor are coupled to an output/input pad of the electronic circuit.

* * * * *